United States Patent [19]
Zaleski et al.

[11] Patent Number: 5,455,791
[45] Date of Patent: Oct. 3, 1995

[54] METHOD FOR ERASING DATA IN EEPROM DEVICES ON SOI SUBSTRATES AND DEVICE THEREFOR

[76] Inventors: Andrzej Zaleski, 3957 Persimmon Dr., Apt. 104, Fairfax, Va. 22031; Dimitris E. Ioannou, 4303L Ramona Dr., Fairfax, Va. 22030

[21] Appl. No.: 252,207

[22] Filed: Jun. 1, 1994

[51] Int. Cl.$^6$ .................................................. G11C 17/00
[52] U.S. Cl. ..................... 365/185.26; 365/218; 257/316; 257/318
[58] Field of Search ..................... 365/218, 185; 257/316, 318, 320, 319

[56] References Cited

U.S. PATENT DOCUMENTS

| | | | |
|---|---|---|---|
| 3,984,822 | 10/1976 | Simko et al. | 257/316 |
| 4,004,159 | 1/1977 | Rai et al. | 257/316 X |
| 4,099,196 | 7/1978 | Simko | 257/320 X |
| 4,162,504 | 7/1979 | Hsu | 257/352 X |
| 4,297,719 | 10/1981 | Hsu | 257/352 X |
| 4,412,311 | 10/1983 | Miccoli et al. | 257/316 X |
| 4,462,089 | 7/1984 | Miida | 365/185 |
| 4,876,582 | 10/1989 | Janning | 365/185 X |
| 4,884,239 | 11/1989 | Ono et al. | 365/185 |
| 4,888,734 | 12/1989 | Lee et al. | 365/185 |
| 5,341,342 | 8/1994 | Brahmbhatt | 365/185 X |
| 5,350,938 | 9/1994 | Matsukawa | 365/185 X |

FOREIGN PATENT DOCUMENTS

| | | | |
|---|---|---|---|
| 63-153865 | 6/1988 | Japan | 365/185 |
| 3-211874 | 9/1991 | Japan | 365/185 |
| 4-25077 | 1/1992 | Japan . | |
| 5-174588 | 7/1993 | Japan | 365/185 |

OTHER PUBLICATIONS

Sinha et al., "Generation and Annihilation of Interface States Under Alternate Hot Electro/Hole Injection in SOI MOSFETs", Oct. 3–6, 1994, IEEE International SOI Conference.

Zaleski et al., "Design and Performance of a New Flash EEPROM o SOI(SIMOX) Substrates", Oct. 3–6, 1994, IEEE International SOI Conference.

Muller et al., "Device Electronics for Integrated Circuits", ©1986, pp. 383–388.

Schroder, "Advanced MOS devices", ©1987, pp. 221–222.

Zaleski et al., "Mechanisms of Hot–Carrier Induced Degradation of SOI (SIMOX) MOSFET's," Microelectronic Engineering 22 (1993) 403–406.

Zaleski et al., "Successive Charging/Discharging of Gate Oxides in SOI MOSFET's by Sequential Hot–Electron Stressing of Front/Back Channel", IEEE Electron Device Letters, vol. 14, No. 9, Sep. 1993.

Yoshikawa et al., "Comparison of Current Flash EePROM Erasing Methods: Stability and How to Control," 1992, IEDM Conference Proceedings, pp. 595–598.

Yamada et al., "A Self–Covergence Erasing Scheme for a Simple Stacked Gate Flash EEPROM", 1991, IEDM Conference Proceedings, pp. 307–310.

*Primary Examiner*—David C. Nelms
*Assistant Examiner*—Son Mai
*Attorney, Agent, or Firm*—Gora L. Singla; Abanti B. Singla

[57] ABSTRACT

A simple stacked gate Electrically Erasable Programmable Read Only Memory (EEPROM) device fabricated on Silicon-on-Insulator (SOI) substrates(films) and a method to erase data in such device as well as in any other EEPROM devices fabricated on SOI substrates(films) is described. The new EEPROM device incorporates two separate control gates, a front control gate and a back control gate. In the new erasing method the back control gate is used to operate back channel of the EEPROM device in the avalanche region and generate hot carriers subsequently injected into the floating gate. The new erasing method is applicable to either n-channel or p-channel, inversion, accumulation or depletion mode devices.

17 Claims, 1 Drawing Sheet

METHOD FOR ERASING DATA IN EEPROM DEVICES ON SOI SUBSTRATES AND DEVICE THEREFOR

BACKGROUND OF THE INVENTION

The invention relates, in general, to non-volatile memory structures and more particularly to the Electrically Erasable Programmable Read Only Memory (hereinafter abbreviated as EEPROM) structures and erasing methods for EEPROM devices on Silicon-on-Insulator (hereinafter abbreviated as SOI) substrates (films).

EEPROMs are a recent addition to the class of non-volatile memories. They are similar to conventional UV EEPROMs, but can be programmed and erased electrically, thus eliminating the need for UV light sources and window packages. EEPROMs use a dual-layer polysilicon gate technology to permanently store charge as exemplified in U.S. Pat. No. 3,984,822 (One Transistor approach), and in U.S. Pat. No. 4,412,311 (Step Gate approach). Floating gate technology is used for the lower-layer polysilicon to store charge that makes the memory cell conducting or non-conducting, thus implementing a logical "1" or "0". The EEPROM cell is usually programmed by charging the floating gate via hot-electron injection from the drain's pinch-off region as described in the "Background of the Invention" of U.S. Pat. No. 4,888,734, which is herein incorporated by reference. The EEPROM cell is usually erased by Fowler-Nordheim (hereinafter abbreviated as F-N) tunneling of the electrons out of the floating gate, as exemplified in U.S. Pat. No. 4,004,159.

The floating gate family of devices are usually inversion mode devices whereby source and drain regions of one conductivity type are formed on a substrate of the opposite conductivity type. Depletion mode devices are also possible, where source, drain, and substrate are all of the same conductivity type. Between the source and drain regions, and on the surface of the substrate, a gate structure is created by first forming a thin oxide layer on the surface of the substrate between the source and the drain regions (the channel region). A conductive layer is then placed over the insulating layer and constitutes the floating gate. A second insulating layer is then formed over the floating gate to completely surround the floating gate and insulate it from the remainder of the device followed by a second conductive layer called the control gate which is formed atop of the insulating layer. Such devices fabricated on standard, bulk silicon substrates are exemplified in U.S. Pat. Nos. 3,984,822, and 4,412,311.

The subject invention relates to the EEPROM structures on SOI substrates and erasing schemes for such devices. There are several examples of EEPROM devices fabricated on SOI substrates as exemplified in U.S. Pat. Nos. 4,162,504, 4,297,719, 4,876,582, and in Japanese Patent 04-25077. None of these references, however, incorporates a back control gate. EEPROMs fabricated on conventional silicon substrates that make use of two separate control gates have been described in the prior art, but both of these gates were located on the top of the device. Additionally, the operation of both of them was based on F-N tunneling, as exemplified in U.S. Pat. No. 4,099,196, and as opposed to hot carrier injection as in the subject invention.

Various methods to erase information in EEPROM devices have been proposed in the prior art. Majority of these methods are based on F-N tunneling of carriers out of the floating gate. They are exemplified by the following methods: High voltage Source with grounded gate Erase (HSE), Negative Gate with positive Source Erase (NGSE), Negative Gate with grounded Channel Erase (NGCE), as described in the article Yoshikawa et al,"Comparison of Current Flash EEPROM Erasing Methods: Stability and How to Control", 1992,1992 IEDM Conference Proceedings, 595–598. F-N tunneling of the carriers out of the floating gate leads to large distribution of threshold voltage after erase, slow erasing speed and interface degradation.

The control of the erased cell threshold voltage is the key issue, because when a programmed cell is read, if there are over-erased cells with negative threshold voltage on the accessed bit line, a read error occurs. Some approaches to solving this problem have been reported as described in the article Yamada et al, "A Self-Convergence Erasing Scheme for a Simple Stacked Gate Flash EEPROM",1991, 1991 IEDM Conference Proceedings, pp. 307–310. In one of the approaches, erase and verify sequences are iterated and to obtain a tight distribution of threshold voltage, a pre-program for all bytes is carried out, and the gradual erase and verify sequence is being iterated until the threshold voltages for all bytes in the array are less than or equal to the desired value. Another approach is to reduce the oxide-ridge on the silicon-dioxide surface by reducing the phosphorous in the floating gate and lowering the annealing temperature after forming the floating gate. In an additional approach, a method known as the self convergence erasing scheme is employed. This method makes use of the avalanche hot carrier injection after erasure by F-N tunneling wherein the threshold voltages converge to a certain steady-state value as a result of the injection. The steady state value is caused by a balance between the avalanche hot electron injection into the floating gate and the avalanche hot hole injection into the floating gate. The erasing sequence eliminates the need for the pre-program and iteration of the erase and verify sequences. However, this process is slow because both F-N tunneling and avalanche hot carrier injection have to be used sequentially. In a different approach as exemplified in U.S. Pat. No. 4,884,239, which is based solely on the hot carrier injection and not on the F-N tunneling, the injection of hot carriers into the floating gate is achieved from a generated reverse avalanche current between the EEPROM drain and substrate.

All methods to erase information in the EEPROM devices described above have inherent shortcomings of large electric fields across the gate dioxide and/or along the front channel and/or problems with the erased threshold voltage distribution and/or erase speed, that are overcome by the subject invention, described hereinbelow.

SUMMARY OF THE INVENTION

New EEPROM structure on SOI substrate(film) and novel method to erase information in such device as well as in any other EEPROM devices fabricated on SOI substrates(films) are described. The EEPROM device is fabricated on SOI substrate and incorporates two separate control gates, located on the opposite sides of the silicon film. One is a conventional control gate fabricated on top of the film, used for writing purposes as in the prior art. The back gate itself is being used as the second control gate, which is located underneath the silicon film. In contrast with previously known erasing methods, the subject of this invention uses the back control gate for erasing purposes.

Some of the advantages of the novel erasing method for

EEPROM structures on SOI substrates are: (i) increased erasing speed as compared to prior art erasing schemes based on the F-N tunneling, (ii) tight distribution of the threshold voltages after erasure, (iii) improved cell durability, and (iv) selective (one cell at a time) or Flash (several cells at a time) erase capability.

DETAILED DESCRIPTION OF THE INVENTION

Figure 1:
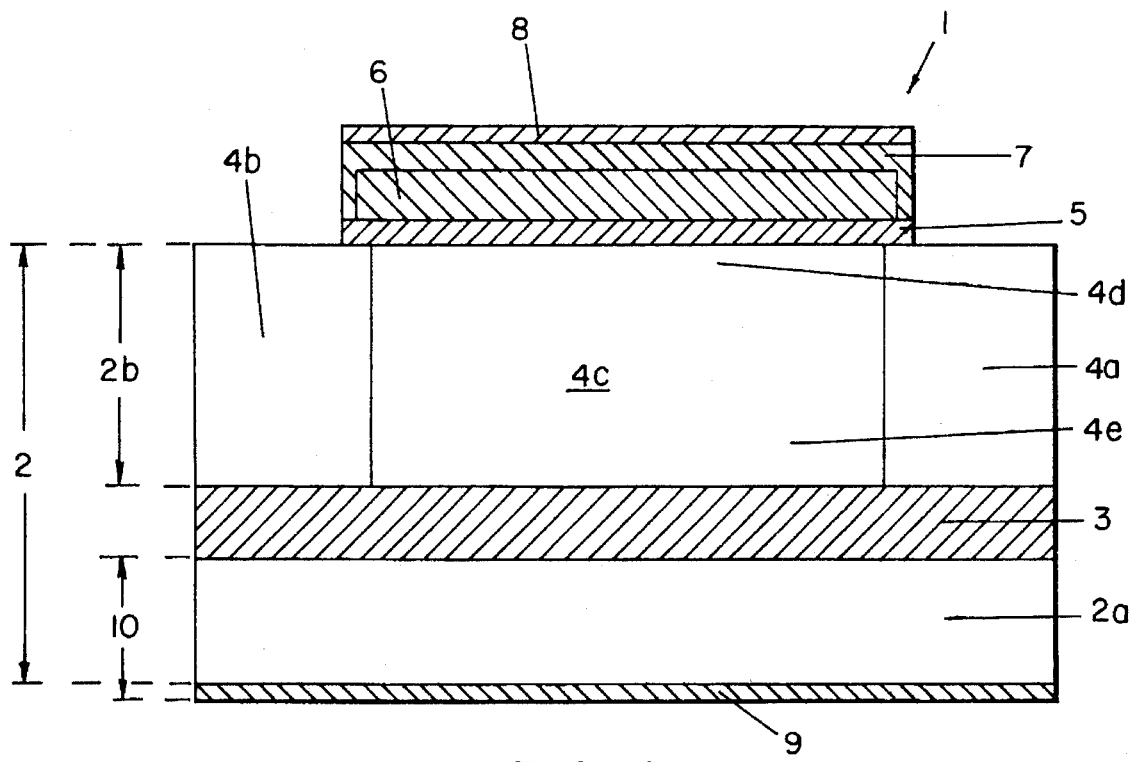
FIG. 1 is a cross-sectional view of a EEPROM device fabricated on an SOI substrate.

Referring to FIG. 1, a non-volatile electrically alterable memory or Flash EEPROM cell device 1, has a substrate layer 2 having a back semiconducting layer 2a and a front semiconducting layer 2b. Back semiconducting layer 2a and front semiconducting layer 2b are separated by a first insulating or back oxide layer 3. Front semiconducting layer 2b has a drain region 4a, a source region 4b which are separated by a channel region 4c, where channel region 4c has a front channel portion 4d and a back channel portion 4e.

A second insulating or front oxide layer 5 is positioned on top of front semiconducting layer 2b, so that channel region 4c and portions of drain region 4a and source region 4b are covered. Drain region 4a, source region 4b and channel region 4c extend from first insulating layer 3 to second insulating layer 5.

A third insulating or inter-poly dielectric layer 7 is positioned over a floating gate 6 such that the entire floating gate 6 is covered by second insulating layer 5 and third insulating layer 7, extending over channel region 4c and portions of drain region 4a and source region 4b. A front control gate 8 is positioned over third insulating layer 7. Back semiconducting layer 2a and back gate contact 9 form back control gate 10. Back gate contact 9 may be positioned at various locations along back semiconducting layer 2a.

Substrate 2 may be a silicon substrate of p-type or n-type conductivity. First insulating layer 3 may be made of silicon dioxide whereas the second and third insulating layers 5 and 7 may be made of silicon dioxide or oxide-nitride-oxide (ONO). Floating gate 6 is made of a conductive material such as polycrystalline silicon of n-type or p-type conductivity. Front gate 8 is made of a conductive material such as polycrystalline silicon, aluminum or silicide. Back gate contact 9 is made of a conductive material such as aluminum, gold or silicide.

A novel feature of device 1 includes positioning front control gate 8 and back control gate 10 on opposite surfaces with respect to front semiconducting layer 2b. The control gates 8 and 10 can be biased simultaneously and independently of one another. Devices 1 are fabricated using known techniques for manufacturing bulk silicon EEPROM devices. Devices 1 can be n-channel, or p-channel inversion, accumulation or depletion mode devices. Devices 1 can be programmed via hot electron or hot hole injection from a drain pinch-off depletion region. Once programmed, devices 1 have enough charge in floating gate 6 of device 1 to sufficiently alter the transistor threshold voltage so as to prevent current flow through device 1, for a specified range of voltages applied to front control gate 8.

The erasing method is described hereinbelow. Data is present as electronic charge, either as electrons or holes in floating gate 6. To erase (neutralize) charges stored in floating gate 6, back channel 4e is turned on by appropriately biasing back control gate 10, drain 4a, and source 4b to operate back channel 4e of device 1, in the avalanche (impact ionization) region. Front control gate 8 is grounded. Neutralizing is defined here as injecting charges of opposite-polarity to those already present in floating gate 6. Alternatively, front control gate 8 is biased to another voltage to keep front channel 4d accumulated, depleted, weakly inverted, or inverted. Values for applied bias voltages are based upon device dimensions and fabrication technologies, and will be obvious to one of ordinary skill in the art.

Hot holes or hot electrons generated by impact ionization adjacent the drain 4a region are injected into floating gate 6 aided by the favorably directed electric field in channel 4c and in front oxide layer 5. In n-channel devices, the erasing method specifically involves injecting the hot holes into floating gate 6 whereas in p-channel devices the erasing method specifically involves injecting the hot electrons into floating gate 6.

Figure 2:
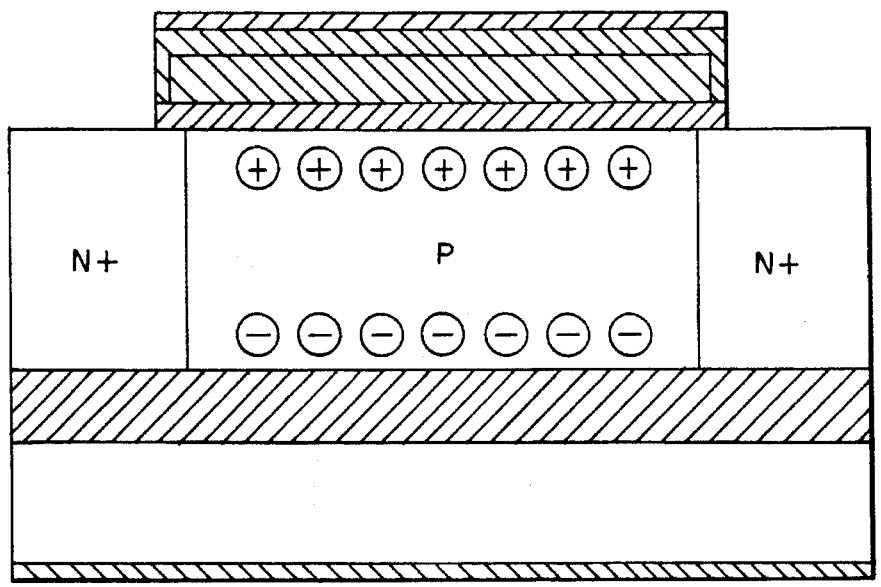
FIG. 2 is a cross-sectional view of the EEPROM device on SOI substrate during application of n-channel embodiment of the erasing method.

FIG. 2 shows an inversion mode n-channel device of the invention with back channel 4e biased in avalanche (impact ionization) region of operation, and front channel 4d accumulated, where the hot holes generated by impact ionization, are injected into floating gate 6. The erasing method of the invention may be used in other types of EEPROM devices such as One Transistor, Step Gate, Three Gate and Step Oxide devices.

What is claimed is:

1. A method for erasing data stored in a Silicon-on-Insulator substrate (SOI) device having a front channel, a source, a drain, a floating gate, a front control gate, a back channel, and a back control gate, the method comprising the steps of:

(a) turning on said back channel by biasing said back control gate;

(b) neutralizing data present as electronic charge in said floating gate by injecting charges having a polarity that is opposite to polarity of the charge already present in said floating gate.

2. The method for erasing as recited in claim 1 further comprising biasing said back channel in avalanche region by biasing said drain and said source.

3. The method for erasing as recited in claim 2, further comprising grounding said front control gate.

4. The method for erasing as recited in claim 3 wherein said device is a n-channel device and wherein said electronic charge is electron charge.

5. The method for erasing as recited in claim 3, wherein said device is a p-channel device and wherein said electronic charge is hole charge.

6. The method for erasing as recited in claim 2 further comprising biasing said front control gate such that said front channel is biased in accumulation.

7. The method for erasing as recited in claim 6 wherein said device is a n-channel device and said electronic charge is electron charge.

8. The method for erasing as recited in claim 6, wherein said device is a p-channel device and said electronic charge is hole charge.

9. The method for erasing as recited in claim 2 further comprising biasing said front control gate such that said front channel is biased in depletion.

10. The method for erasing as recited in claim 9 wherein said device is a n-channel device and said electronic charge is electron charge.

11. The method for erasing as recited in claim 9, wherein said device is a p-channel device and said electronic charge is hole charge.

12. The method for erasing as recited in claim 2 further comprising biasing said front control gate such that said from channel is biased in weak inversion.

13. The method for erasing as recited in claim 12 wherein said device is a n-channel device and said electronic charge is electron charge.

14. The method for erasing as recited in claim 12, wherein said device is a p-channel device and said electronic charge is hole charge.

15. The method for erasing as recited in claim 2 further comprising biasing said front control gate such that said front channel is biased in inversion.

16. The method for erasing as recited in claim 15 wherein said device is a n-channel device and said electronic charge is electron charge.

17. The method for erasing as recited in claim 15, wherein said device is a p-channel device and said electronic charge is hole charge.

* * * * *